(12) United States Patent
Lee et al.

(10) Patent No.: US 7,251,170 B2
(45) Date of Patent: Jul. 31, 2007

(54) PERIPHERAL VOLTAGE GENERATOR

(75) Inventors: Jong-Won Lee, Ichon-shi (KR); Ho-Uk Song, Ichon-shi (KR)

(73) Assignee: Hynix Semiconductor Inc. (KR)

( * ) Notice: Subject to any disclaimer, the term of this patent is extended or adjusted under 35 U.S.C. 154(b) by 55 days.

(21) Appl. No.: 11/302,337

(22) Filed: Dec. 14, 2005

(65) Prior Publication Data

US 2007/0053226 A1 Mar. 8, 2007

(30) Foreign Application Priority Data

Sep. 5, 2005 (KR) ...................... 10-2005-0082245

(51) Int. Cl.
*G11C 5/14* (2006.01)
(52) U.S. Cl. .................. 365/189.09; 365/222; 365/227
(58) Field of Classification Search ........... 365/189.09, 365/222, 227
See application file for complete search history.

(56) References Cited

U.S. PATENT DOCUMENTS

| 5,886,932 | A | 3/1999 | Choi |
| 6,590,444 | B2 | 7/2003 | Ikehashi et al. |
| 6,696,867 | B2 | 2/2004 | Keeth et al. |
| 6,934,173 | B2 | 8/2005 | Keeth et al. |
| 7,035,157 | B2 * | 4/2006 | Chang ........................ 365/222 |
| 2002/0114204 | A1 | 8/2002 | Thijs et al. |

FOREIGN PATENT DOCUMENTS

| JP | 11-328952 A | 11/1999 |
| JP | 2000-149557 A | 5/2000 |
| JP | 2001-52476 A | 2/2001 |
| JP | 2003-133935 A | 5/2003 |
| JP | 2003-208800 A | 7/2003 |
| JP | 2003-338178 A | 11/2003 |
| KR | 1999-013146 A | 2/1999 |
| KR | 10-2004-0007905 A | 1/2004 |

OTHER PUBLICATIONS

Korean Office Action issued in corresponding Korean Patent Application No. 10-2005-0082245, dated Nov. 18, 2006.

* cited by examiner

*Primary Examiner*—Van Thu Nguyen
*Assistant Examiner*—N Nguyen
(74) *Attorney, Agent, or Firm*—McDermott Will & Emery LLP

(57) ABSTRACT

A peripheral voltage generator is provided for reducing an operating current by generating a peripheral voltage within a mobile SDRAM, and a current is used in a deep-power down mode and a self refresh mode to thereby enhance operational characteristics. The peripheral voltage generator includes a reference voltage generating unit for generating a peripheral reference voltage having a different level in response to an enable signal and a self-refresh signal; a comparing unit for comparing the peripheral reference voltage with a peripheral driving voltage to thereby output a peripheral voltage control signal based on the comparison result; and a peripheral voltage control unit for generating the peripheral driving voltage having a first peripheral level in response to the peripheral voltage control signal.

20 Claims, 3 Drawing Sheets

PERIPHERAL VOLTAGE GENERATOR

FIELD OF THE INVENTION

The present invention relates to a semiconductor memory device; and, more particularly, to a peripheral voltage generator for reducing an operating current by generating a peripheral voltage within a mobile synchronous dynamic random access memory and a current used in a deep-power down mode and a self refresh mode to thereby enhance an operational characteristic.

DESCRIPTION OF RELATED ART

In general, a semiconductor memory device includes a plurality of memory cells, a plurality of sense amplifiers for driving the memory cells, and a plurality of address control blocks for operating row control blocks and the sense amplifiers in an exact order.

In a normal operation, the semiconductor memory device generates necessary signals by simultaneously operating the row control blocks and the address control blocks according to a command and an address signal inputted from an external system. Specific sense amplifier arrays are operated according to a combination of the command and the address signals. Then, data are written to memory cells connected to the sense amplifiers, or data are read out to the chip.

In a nonvolatile memory cell consisting of one transistor and one capacitor, data is stored in the capacitor. At this point, a leakage current is generated due to characteristics of the capacitor. In order to retain the stored data for a long time, a refresh operation is performed to restore the stored data at regular intervals.

Among the refresh operation modes, an auto-refresh mode is a mode that performs a refresh operation during the normal operation. When a system is idle for a long time, the semiconductor memory device often maintains a specific state in which the system performs only a minimum operation so as to reduce a power consumption. At this point, a refresh operation is necessary for correctly retaining the data in the memory cell. In this case, a self-refresh operation is performed.

This refresh operation is basically identical to a row active, which is a precharge operation in the normal operation of the semiconductor memory device. That is, the refresh operation is achieved by a series of operations, including the steps of amplifying data stored in the memory cell through an amplifier, and rewriting the amplified data in the memory cell. In the case of the self-refresh operation, the refresh operation has to be performed at regular intervals without commands inputted from the external system. Therefore, the self-refresh operation is independently performed within the chip.

In other words, the self-refresh operation is not an operation that performs the refresh operation by external commands, but an operation that performs the refresh operation by generating necessary commands within the chip at regular periods or when a predetermined condition is satisfied.

Meanwhile, as the semiconductor device is integrated more highly, a gate length of a transistor is reduced and a threshold voltage is lowered. Consequently, there is a limitation in reducing a current consumption because of increasing an off leakage current of the transistor.

Specifically, with an advance of a radio communication, it is important to develop a variety of contents and reduce power consumption in mobile products. For this purpose, an operating voltage of an existing SDRAM also decreases from 3.3V or 2.5V to 1.8V or 1.5. On the contrary, while reducing the operating voltage, a data rate or operating frequency of the chip needs to be maintained at the equal levels. Hence, peripheral circuits of the DRAM use an external voltage without generating any separate internal voltage. Accordingly, there is an increasing demand for the semiconductor memory device that can minimize an amount of a standby current and an amount of a current used in a deep-power down mode or self-refresh mode.

SUMMARY OF THE INVENTION

It is, therefore, an object of the present invention to provide a peripheral voltage generator that can supply a peripheral voltage equal to an external power supply voltage in a normal operation mode, supply the peripheral voltage lower than the external power supply voltage in a self-refresh mode, and supply the peripheral voltage of a ground voltage in a deep-power down mode, thereby reducing a current used in the deep-power down mode and self refresh mode.

It is another object of the present invention to provide a peripheral voltage generator that can restore the peripheral voltage to a level at which a normal operation is possible within a short time by shorting an output node of a peripheral voltage and a source voltage supply for a predetermined time when exiting the deep-power down mode or self-refresh mode, thereby enhancing the operation characteristics.

In accordance with an aspect of the present invention, there is provided a peripheral voltage generator including: a reference voltage generating unit for generating a peripheral reference voltage having a different level in response to an enable signal and a self-refresh signal; a comparing unit for comparing the peripheral reference voltage with a peripheral driving voltage to thereby output a peripheral voltage control signal based on the comparison result; and a peripheral voltage control unit for generating the peripheral driving voltage having a first peripheral level in response to the peripheral voltage control signal.

In accordance with another aspect of the present invention, there is provided a semiconductor memory device for supplying a peripheral driving voltage to peripheral blocks including: a reference voltage generating unit for generating a peripheral reference voltage having a different level in response to an enable signal and a self-refresh signal; a comparing unit for comparing the peripheral reference voltage with a peripheral driving voltage to thereby output a peripheral voltage control signal based on the comparison result; and a peripheral voltage control unit for generating the peripheral driving voltage having a first peripheral level in response to the peripheral voltage control signal.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE INVENTION

Other objects and aspects of the invention will become apparent from the following description of the embodiments with reference to the accompanying drawings, which is set forth hereinafter.

Figure 1:
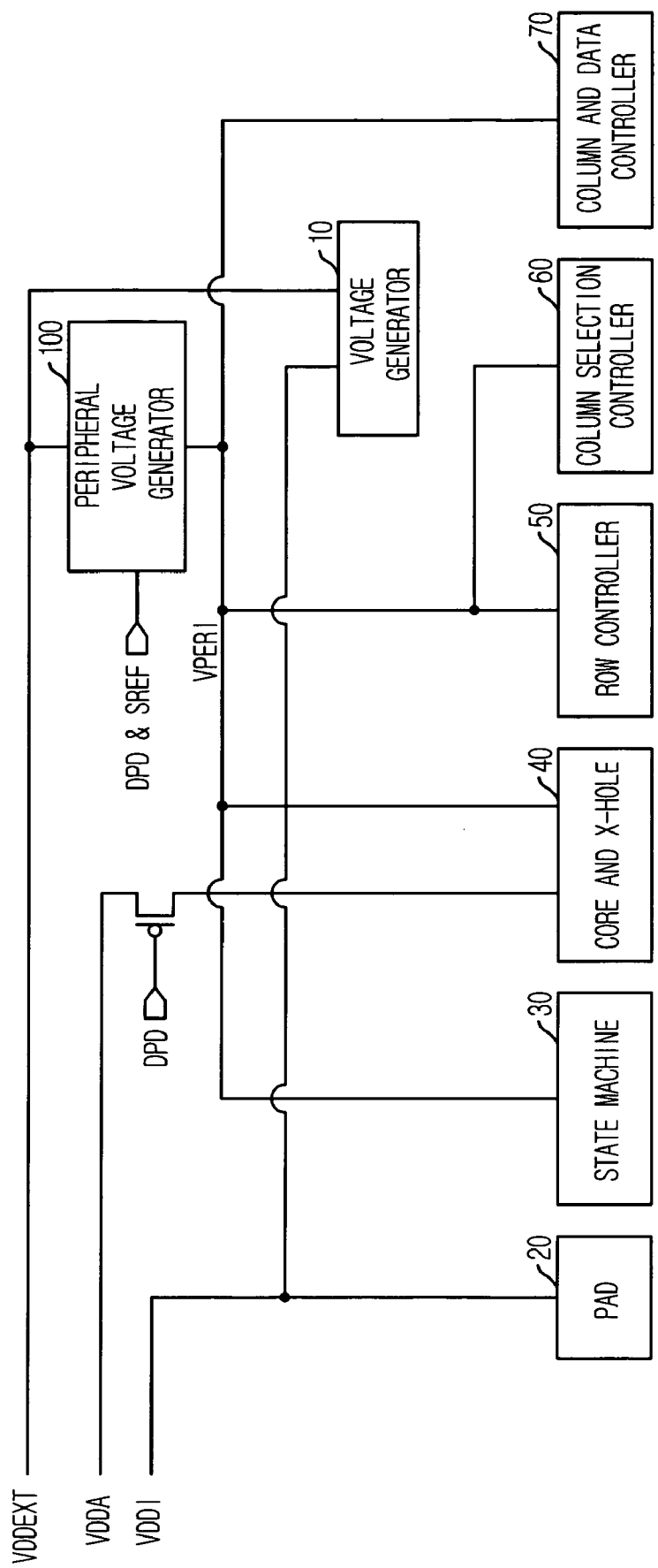
FIG. 1 is a block diagram of a semiconductor memory device with a peripheral voltage generator in accordance with an embodiment of the present invention.

FIG. 1 is the block diagram of a semiconductor memory device with a peripheral voltage generator in accordance with an embodiment of the present invention.

Referring to FIG. 1, a semiconductor memory device includes a peripheral voltage generator 100, a voltage generator 10, a pad 20, a state machine 30, a core and X-hole 40, a row controller 50, a column selection controller 60, and a column and data controller 70.

When the semiconductor memory device is in a standby state, unnecessary peripheral circuits are disabled so as to minimize the power consumption. Also, when the semiconductor memory device is in the standby state for a long time, it enters a deep-power down (DPD) mode that stops the operation of the peripheral circuits so as to reduce unnecessary power dissipated in the standby mode.

The deep-power down mode is controlled by a command inputted from an external. That is, the semiconductor memory device enters the deep-power down mode or exits from the deep-power down mode according to the command inputted through the pad 20 from the external.

In order to reduce the power consumption of the semiconductor memory device in the deep-power down (DPD) mode or a self-refresh (SREF) mode, the peripheral voltage generator 100 is provided within the semiconductor memory device so as to generate a peripheral voltage (VPERI) as an operating voltage of the peripheral circuits.

Figure 2:
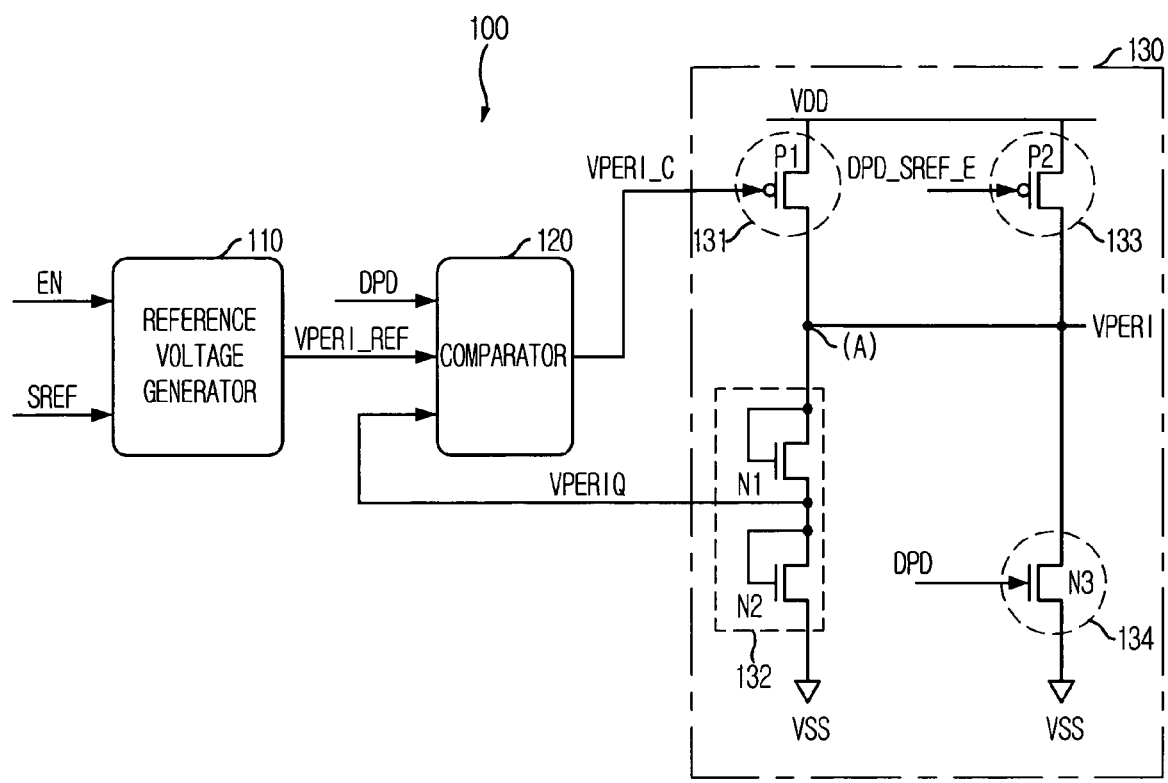
FIG. 2 is a circuit diagram of the peripheral voltage generator shown in FIG. 1.

FIG. 2 is a circuit diagram of the peripheral voltage generator 100 in accordance with an embodiment of the present invention.

Referring to FIG. 2, the peripheral voltage generator 100 includes a reference voltage generator 110, a comparator 120, and a peripheral voltage controller 130.

When an enable signal EN is activated, the reference voltage generator 110 generates a peripheral reference voltage VPERI_REF, a level of which corresponds to that of a normal operation mode. Also, when a self-refresh signal SREF is activated, the reference voltage generator 110 generates the peripheral reference voltage VPERI_REF, a level of which is lower than that in the normal operation mode by a predetermined voltage.

The comparator 120 compares the peripheral reference voltage VPERI_REF with a peripheral voltage VPERIQ applied from the peripheral voltage controller 130 and then generates a peripheral voltage control signal VPERI_C. At this point, the comparator 120 is disabled when a deep-power down signal DPD is activated.

The peripheral voltage generator 130 includes a peripheral driving unit 131, a diode unit 132, a shorting unit 133 and a deep-power down control unit 134.

The peripheral voltage driving unit 131 may be configured with a first PMOS transistor P1 which is connected between a source voltage VDD supply and a node A, and has a gate receiving the peripheral voltage control signal VPERI_C. The diode unit 132 may be configured with a first NMOS transistor N1 and a second NMOS transistor N2 connected in series between the node A and a ground voltage VSS supply. Each of the first and second NMOS transistors N1 and N2 has a gate connected to its own source. The diode unit 132 outputs the peripheral voltage VPERIQ to the comparator 120.

The shorting unit 133 may be configured with a second PMOS transistor P2 which is connected between the source voltage VDD supply and the node A, and has a gate receiving a deep-power down/self-refresh exit signal DPD_SREF_E.

The deep-power down control unit 134 may be configured with a third NMOS transistor N3 which is connected between the node A and the ground voltage VSS supply, and has a gate receiving the deep-power down signal DPD.

Figure 3:
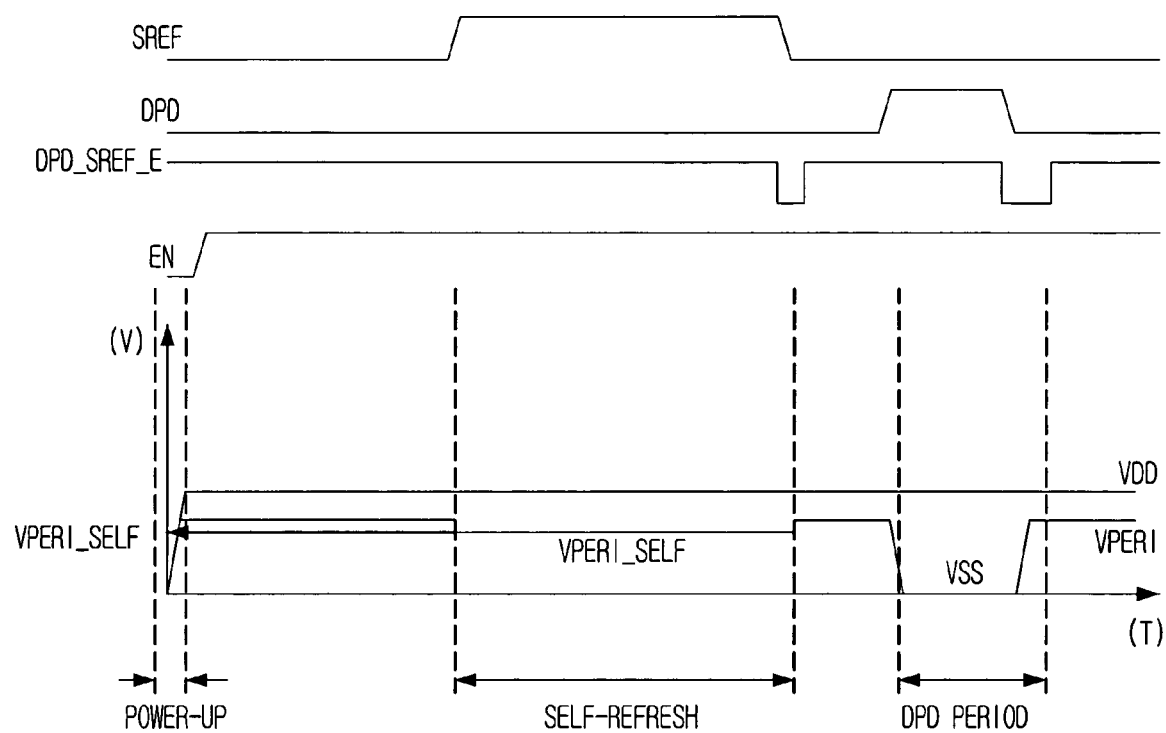
FIG. 3 is a timing diagram of the peripheral voltage generator shown in FIG. 1.
}

An operation of the semiconductor device in accordance with the present invention will be described below with reference to a timing diagram of FIG. 3.

First, when the enable signal EN is activated, the reference voltage generator 110 generates the peripheral reference voltage VPERI_REF, the level of which corresponds to that of the normal operation mode. Then, when the self-refresh signal SREF is activated, the reference voltage generator 110 generates the peripheral reference voltage VPERI_REF, the level of which is lower than that in the normal operation mode by the predetermined voltage.

The comparator 120 compares the peripheral reference voltage VPERI_REF with the peripheral voltage VPERIQ outputted from the diode unit 132 and then generates the peripheral voltage control signal VPERI_C. At this point, if the deep-power down signal DPD is activated in the deep-power down mode, the comparator 120 is disabled and the third NMOS transistor N3 is turned on so that the peripheral voltage VPERI is outputted as a level of the ground voltage VSS.

When the self-refresh signal SREF changes from a low level to a high level in the self-refresh mode, the reference voltage generator 110 generates the peripheral reference voltage VPERI_REF, the level of which is lower than that in the normal operation mode by the predetermined voltage. The comparator 120 compares the peripheral reference voltage VPERI_REF with the peripheral voltage VPERIQ whose level is dropped by the diode unit 132, and then outputs the peripheral voltage control signal VPERI_C as a low level. Accordingly, the first PMOS transistor P1 is turned on to output the peripheral voltage VPERI as a peripheral voltage VPERI_SELF lower than the source voltage VDD supply.

Meanwhile, when exiting the deep-power down mode or the self-refresh mode, the deep-power down/self-refresh exit signal DPD_SREF_E is activated so that a low pulse is generated for a predetermined time. Accordingly, the second PMOS transistor P2 is turned on. Therefore, an output node of the peripheral voltage VPERI is shorted with an external voltage VEXT supply or the source voltage VDD supply for a predetermined time. Consequently, a level of the peripheral voltage VPERI can be rapidly restored to a voltage level at which the normal operation is possible.

Wherein, in exiting the deep-power down mode or the self-refresh mode, a pulse width of the deep-power mode/self-refresh exit signal DPD_SREF_E is controlled differently. That is, in exiting the self-refresh mode, a voltage level to be restored is low because a voltage difference between the source voltage VDD and the peripheral voltage VPERI_SELF is not high. Accordingly, the pulse width of the deep-power down/self-refresh exit signal DPD_SREF_E is set to be narrow.

On the contrary, in exiting the deep-power down mode, a voltage level to be restored is high because a voltage difference between the source voltage VDD and the ground voltage VSS is high. Accordingly, the pulse width of the deep-power down/self-refresh exit signal DPD_SREF_E is set to be wide.

Consequently, in the normal operation, the peripheral voltage VPERI having a voltage level equal to the source voltage VDD or the external voltage VEXT is generated. Meanwhile, in the self-refresh mode, the peripheral voltage VPERI_SELF enabling the normal operation of the peripheral circuits as well as having a level lower than the source voltage VDD or the external voltage VEXT is generated.

In addition, in the deep-power down mode, the peripheral voltage VPERI lower than the voltage VPERI_SELF or equal to the ground voltage VSS is outputted. Therefore, the current consumed in the self-refresh mode or the deep-power down mode can be reduced.

Meanwhile, in exiting the self-refresh mode or the deep-power down mode, the mobile SDRAM has to maintain a state in which the normal operation is possible within a predetermined time.

For this purpose, when the deep-power down/self-refresh exit signal DPD_SREF_E is activated, the output node of the peripheral voltage VPERI is shorted with the source voltage VDD supply or the external power VEXT supply for a predetermined time. Therefore, the peripheral voltage VPERI can be set a voltage level at which the normal operation is possible within a sufficient time.

As described above, the operating current can be reduced by generating the peripheral voltage VPERI within the mobile SDRAM. Also, the current used in the deep-power down mode or the self-refresh mode can be reduced.

Further, in exiting the deep-power down mode or the self-refresh mode, the operation characteristics can be enhanced by restoring the peripheral voltage to a level at which the normal operation is possible within a short time.

The present application contains subject matter related to Korean patent application No. 2005-82245, filed in the Korean Intellectual Property Office on Sep. 5, 2005, the entire contents of which is incorporated herein by reference.

While the present invention has been described with respect to certain preferred embodiments, it will be apparent to those skilled in the art that various changes and modifications may be made without departing from the scope of the invention as defined in the following claims.

What is claimed is:

1. A peripheral voltage generator for supplying a peripheral driving voltage to peripheral blocks in semiconductor memory device, comprising:
 a reference voltage generating unit for generating a peripheral reference voltage having a different level in response to an enable signal and a self-refresh signal;
 a comparing unit for comparing the peripheral reference voltage with a peripheral driving voltage to thereby output a peripheral voltage control signal based on the comparison result; and
 a peripheral voltage control unit for generating the peripheral driving voltage having a first peripheral level in response to the peripheral voltage control signal.

2. The peripheral voltage generator as recited in claim 1, wherein a level of the peripheral reference voltage corresponds to that of a normal operation mode when an enable signal is activated, and is lower than that in the normal operation mode by a predetermined voltage when a self-refresh signal is activated.

3. The peripheral voltage generator as recited in claim 1, wherein the comparing unit is disabled when a deep-power down signal activated in a deep-power down mode is activated.

4. The peripheral voltage generator as recited in claim 1, wherein the first peripheral level is made by dropping the peripheral driving voltage whose level is equal to a level of a source voltage, according to the peripheral voltage control signal.

5. The peripheral voltage generator as recited in claim 4, wherein the peripheral voltage control unit includes:
 a first peripheral voltage driving unit for generating a first peripheral voltage in response to the peripheral voltage control signal; and
 a diode unit for receiving the first peripheral voltage to generate the peripheral driving voltage having the first peripheral level.

6. The peripheral voltage generator as recited in claim 5, wherein the first peripheral voltage driving unit includes a first PMOS transistor that is connected between the source voltage supply and the diode unit, and has a gate receiving the peripheral voltage control signal.

7. The peripheral voltage generator as recited in claim 5, wherein the diode unit includes a first NMOS transistor and a second NMOS transistor in series between the first peripheral voltage driving unit and a ground voltage supply, each gate of the first NMOS transistor and the second NMOS transistor being connected to its own drain.

8. The peripheral voltage generator as recited in claim 5, wherein the peripheral voltage control unit further includes a deep-power down control unit for generating the peripheral driving voltage having a second peripheral level in response to a deep-power down mode signal activated in a deep-power down mode is activated.

9. The peripheral voltage generator as recited in claim 8, wherein the second peripheral level has a level of the ground voltage.

10. The peripheral voltage generator as recited in claim 9, wherein the deep-power down control unit includes a third NMOS transistor that is connected between the first peripheral voltage node and the ground voltage supply, and has a gate receiving the deep-power down signal.

11. The peripheral voltage generator as recited in claim 5, wherein the peripheral voltage control unit further includes a second peripheral voltage driving unit for outputting a third peripheral level as the peripheral driving voltage for a predetermined time when exiting a self-refresh mode or a deep-power down mode.

12. The peripheral voltage generator as recited in claim 11, wherein the third peripheral level has a level of the source voltage.

13. The peripheral voltage generator as recited in claim 12, wherein the second peripheral voltage driving unit includes a second PMOS transistor that is connected between the source voltage supply and the first peripheral voltage node, and has a gate receiving a deep-power down/self-refresh exit signal activated when exiting the self-refresh mode or the deep-power down mode.

14. The peripheral voltage generator as recited in claim 13, wherein the peripheral voltage control unit differently controls a pulse width of the deep-power down/self-refresh exit signal in exiting from the self-refresh mode or the deep-power down mode.

15. The peripheral voltage generator as recited in claim 14, wherein the pulse width of the deep-power down/self-refresh exit signal is set to be narrower in the exit of the self-refresh mode than in the exit of the deep-power down mode.

16. A semiconductor memory device for supplying a peripheral driving voltage to peripheral blocks, comprising:
 a reference voltage generating unit for generating a peripheral reference voltage having a different level in response to an enable signal and a self-refresh signal;
 a comparing unit for comparing the peripheral reference voltage with a peripheral driving voltage to thereby output a peripheral voltage control signal based on the comparison result; and a peripheral voltage control unit for generating the peripheral driving voltage having a first peripheral level in response to the peripheral voltage control signal.

17. The device as recited in claim 16, wherein the first peripheral level is made by dropping the peripheral driving voltage whose level is equal to a level of a source voltage, according to the peripheral voltage control signal.

18. The device as recited in claim 17, wherein the peripheral voltage control unit includes:
 a first peripheral voltage driving unit for generating a first peripheral voltage in response to the peripheral voltage control signal; and
 a diode unit for receiving the first peripheral voltage to generate the peripheral driving voltage having the first peripheral level.

19. The device as recited in claim 18, wherein the peripheral voltage control unit further includes a deep-power down control unit for generating the peripheral driving voltage having a second peripheral level having a level of the ground voltage, in response to a deep-power down mode signal activated in a deep-power down mode is activated.

20. The peripheral voltage generator as recited in claim 18, wherein the peripheral voltage control unit further includes a second peripheral voltage driving unit for outputting a third peripheral level having a level of the source voltage as the peripheral driving voltage for a predetermined time when exiting a self-refresh mode or a deep-power down mode.

* * * * *